(12) United States Patent
Lian et al.

(10) Patent No.: US 12,228,603 B2
(45) Date of Patent: Feb. 18, 2025

(54) WAFER-LEVEL SEMICONDUCTOR HIGH-VOLTAGE RELIABILITY TEST FIXTURE

(71) Applicant: SEMIGHT INSTRUMENTS CO., LTD, Suzhou (CN)

(72) Inventors: Zhe Lian, Suzhou (CN); Pengsong Xu, Suzhou (CN); Jianjun Huang, Suzhou (CN); Haiyang Hu, Suzhou (CN)

(73) Assignee: SEMIGHT INSTRUMENTS CO., LTD, Suzhou (CN)

( * ) Notice: Subject to any disclaimer, the term of this patent is extended or adjusted under 35 U.S.C. 154(b) by 0 days.

(21) Appl. No.: 18/427,064

(22) Filed: Jan. 30, 2024

(65) Prior Publication Data

US 2025/0012845 A1    Jan. 9, 2025

Related U.S. Application Data

(63) Continuation of application No. PCT/CN2023/134123, filed on Nov. 24, 2023.

(30) Foreign Application Priority Data

Jul. 5, 2023 (CN) .......................... 202310820196.8

(51) Int. Cl.
*G01R 31/26* (2020.01)
(52) U.S. Cl.
CPC ................................ *G01R 31/2621* (2013.01)
(58) Field of Classification Search
CPC ... G01R 1/02; G01R 1/04; G01R 1/06; G01R 1/073; G01R 31/00; G01R 31/26;
(Continued)

(56) References Cited

U.S. PATENT DOCUMENTS

| 2009/0058440 A1* | 3/2009 | Miura | G01R 31/2889 324/750.16 |
| 2010/0134121 A1* | 6/2010 | Sato | G01R 31/2889 324/538 |

(Continued)

FOREIGN PATENT DOCUMENTS

| CN | 104678130 A | 6/2015 |
| CN | 205049689 U | 2/2016 |

(Continued)

*Primary Examiner* — Son T Le
(74) *Attorney, Agent, or Firm* — ANOVA LAW GROUP, PLLC

(57) ABSTRACT

A wafer-level semiconductor high-voltage reliability test fixture is provided. The test fixture includes: a first insulation plate, a first circuit board, and a second insulation plate. A target object is disposed between the first circuit board and the second insulation plate. A side of the first circuit board facing the target object is provided with a probe holder including probes. The first circuit board is connected to the target object through the probes such that a high-voltage electrical signal is transmitted to the target object when the high-voltage electrical signal is applied to the first circuit board. The first insulation plate and the second insulation plate isolate the high-voltage electrical signal from the outside world, and the probes also transmit test electrical signals to the target object and transmit feedback signals to the first circuit board when the test electrical signals are applied to the first circuit board.

9 Claims, 11 Drawing Sheets

(58) Field of Classification Search
CPC ............ G01R 31/2621; G01R 31/2635; G01R 31/2601; G01R 31/2642; G01R 31/28; G01R 1/0491; G01R 31/318505; G01R 31/311

See application file for complete search history.

(56) References Cited

U.S. PATENT DOCUMENTS

| | | | | |
|---|---|---|---|---|
| 2015/0008945 | A1* | 1/2015 | Kiyofuji | ............ G01R 31/2887 324/750.03 |
| 2020/0400739 | A1* | 12/2020 | Otabe | ................ G01R 31/2818 |

FOREIGN PATENT DOCUMENTS

| | | | |
|---|---|---|---|
| CN | 214174472 | U | 9/2021 |
| CN | 114859199 | A | 8/2022 |
| CN | 218412422 | U | 1/2023 |
| CN | 115792557 | A | 3/2023 |
| CN | 116165517 | A | 5/2023 |
| CN | 116754918 | A | 9/2023 |
| JP | 2000195911 | A | 7/2000 |
| JP | 2008145238 | A | 6/2008 |

\* cited by examiner

WAFER-LEVEL SEMICONDUCTOR HIGH-VOLTAGE RELIABILITY TEST FIXTURE

CROSS-REFERENCE TO RELATED APPLICATION

This application is a continuation of International Application No. PCT/CN2023/134123, filed on Nov. 24, 2023, which claims priority to Chinese Patent Application No. 202310820196.8, filed on Jul. 5, 2023, the content of all which is incorporated herein by reference in its entirety.

TECHNICAL FIELD

The present disclosure generally relates to the field of semiconductor test technology and, more particularly, relates to a wafer-level semiconductor high-voltage reliability test fixture.

BACKGROUND

High-voltage metal-oxide-semiconductor field effect transistors (MOSFETs) are increasingly used as switching devices in new energy vehicles. The reliability verification of high-voltage MOSFETs can only be carried out after a wafer is cut and packaged into devices, which will waste a lot of manpower and material resources. There is currently no available test fixture for high-voltage reliability verification of wafer-level MOSFETs. Therefore, there is an urgent need for reliability verification equipment to verify the reliability of gate bias (GB) and reverse bias (RB) for wafer-level MOSFETs. The WLR equipment available on the market can only perform GB verification and does not have a high-voltage RB verification function. However, as the high-voltage performance is the main performance of Sic as the third-generation semiconductor, the reliability of the high-voltage RB needs to be verified.

SUMMARY

Various embodiments of the present disclosure provide a wafer-level semiconductor high-voltage reliability test fixture, to at least partially alleviate the problems that the high-voltage performance is not able to be tested on semiconductors in existing technologies and also alleviate the problems of scratches on a target object induced by probes.

One aspect of the present disclosure provides a wafer-level semiconductor high-voltage reliability test fixture. The test fixture includes: a first insulation plate, a first circuit board, and a second insulation plate arranged in sequence. A target object is disposed between the first circuit board and the second insulation plate. A side of the first circuit board facing the target object is provided with a probe holder, and probes are provided on the probe holder. The first circuit board is connected to the target object through the probes such that a high-voltage electrical signal is transmitted to the target object through the probes for high-voltage performance testing when the high-voltage electrical signal is applied to the first circuit board. The first insulation plate and the second insulation plate isolate the high-voltage electrical signal from the outside world, and the probes are also configured to transmit a test electrical signal to the target object and transmit a feedback signal to the first circuit board when the test electrical signal is applied to the first circuit board.

Optionally, the first insulation plate and the second insulation plate are each made of a plastic plate or a ceramic plate.

Optionally, the dimension of the plastic plate is about 10 mm to about 20 mm.

Optionally, the test fixture further includes a first heating sheet, disposed on a side of the second insulation plate away from the target object; a second circuit board, used to transmit heating electrical signals to the first heating sheet, wherein the second circuit board is disposed on a side of the first insulation plate away from the first circuit board; and an insulation block, disposed at the position of the target object. The insulation block is provided with a plurality of first through holes and conductive posts are provided in the plurality of first through holes. The second insulation plate is provided with second through holes for the conductive posts to pass through, such that one end of one conductive post is connected to one corresponding probe and another end of the conductive post is connected to the first heating sheet after passing through one corresponding first through hole and one corresponding second through hole. The heating electrical signals pass through the first insulation plate and the first circuit board, and are transmitted to the first heating sheet through the probes and the conductive posts.

Optionally, the test fixture further includes a second heating sheet. The second heating sheet is disposed on a side of the first circuit board opposite to the probe holder, and has a shape matching the probe holder; and the second heating sheet is electrically connected to the second circuit board such that the heating electrical signals of the second circuit board are transmitted to the first heating sheet and the second heating sheet simultaneously, therefore causing the second heating sheet and the first heating sheet to heat simultaneously.

Optionally, the test fixture further includes a heat sink. The target object is disposed on the heat sink and the heat sink is disposed between the target object and the first heating sheet; and the probes are also connected to the heat sink to transmit the high-voltage electrical signal to the heat sink and then to the target object; and heat at the first heating sheet is transferred to the target object through the heat sink at the same time.

Optionally, the heat sink includes: at least one vacuum hole disposed at a side surface of the heat sink close to the target object and used to tightly attach the target object to the heat sink; and a groove, an opening of which is provided on a periphery of the heat sink for accommodating the insulation block.

Optionally, the heat sink is made of copper or gold-plated copper.

Optionally, the test fixture further includes a thermal insulation plate disposed on a side of the first heating sheet away from the second insulation plate.

Optionally, the thermal insulation plate is made of silica gel.

Optionally, the test fixture further includes a sealing assembly including a sealing frame and a sealing ring. The sealing frame forms a frame structure with an opening; the opening is connected to a side of the first circuit board on which the probe holder is provided, to form a sealing cavity. The sealing cavity is used to accommodate the probe holder, the target object, the heat sink, the first heating sheet, the second insulation plate, and the thermal insulation plate. The sealing ring is disposed at the position of the opening of the sealing frame for sealing when the sealing frame is connected to the first circuit board.

Optionally, the test fixture further includes a metal decorative plate. The metal decorative plate is provided on the side of the first insulating plate away from the first circuit board; and third through holes are provided on the metal decorative plate and the second circuit board is provided on the positions of the third through holes.

Optionally, the target object is a wafer-level semiconductor piece.

Optionally, the target object is a SiC wafer.

Optionally, the second circuit board includes solder joints for the probes.

Optionally, the first insulation layer is disposed between the first circuit board and the second circuit board, and includes probe mounting holes corresponding to the solder joints of the second circuit board. The probe mounting holes are used to mount the probes.

Optionally, the first circuit board includes solder joints corresponding to the solder joints on the second circuit board.

Optionally, the first circuit board, the first insulation plate, and the metal decorative plate are fastened to each other to form a cover plate.

Optionally, the target object, the heat sink, the second insulation plate, the first heating sheet, and the thermal insulation plate are arranged in sequence under the cover plate.

Optionally, a bottom of the sealing frame is provided with threaded seat mounting holes, positioning holes, vacuum suction holes and screw holes.

In the present disclosure, the probe holder may be provided between the target object and the first circuit board. The probe holder may be provided with probes to transmit the high-voltage electrical signals at the first circuit board to the target object to perform high-voltage test on the target object. The first insulation plate and the second insulation plate may be provided on two sides of the target object and the first circuit board. The first insulation plate and the second insulation plate may prevent the target object from high-voltage spark during high-voltage testing, ensuring the safety of the test when performing the high-voltage test on the target object.

Further, the second heating sheet and the first heating sheet may be respectively disposed on two sides of the probe holder and the target object. While the first heating sheet heats the target object, the second heating sheet may also heat up. Therefore, scratches on the target object caused by the different heating speeds on two sides of the probes may be prevented.

Further, a sealed space may be formed between the sealing assembly and the cover plate as a whole, such that the target object may be prevented from contacting the outside air and oxidation when being heated. And high-voltage isolation may be achieved. Further, the setting of the sealing assembly may also ensure that the pressure in the sealing cavity is able to reach 0.6 mPa. Therefore, the sealing cavity may be filled with high-voltage arc-extinguishing gas to further prevent high-voltage spark.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Obviously, the described embodiments are just some of the embodiments of the present disclosure, but not all of the embodiments. Based on the embodiments in this disclosure, all other embodiments obtained by those of ordinary skill in the art without creative work shall fall within the scope of this disclosure.

Figure 1:
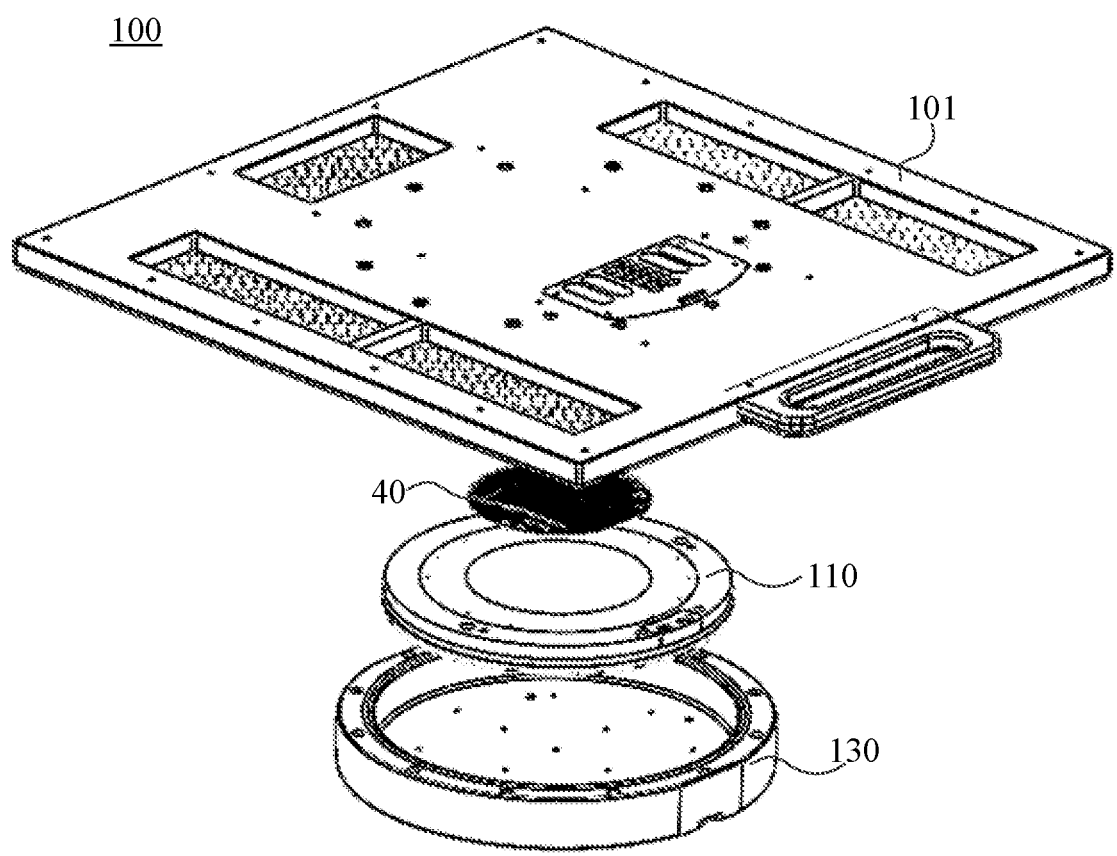
FIG. 1 illustrates an exemplary wafer-level semiconductor high-voltage reliability test fixture according to various disclosed embodiments of the present disclosure.
Figure 2:
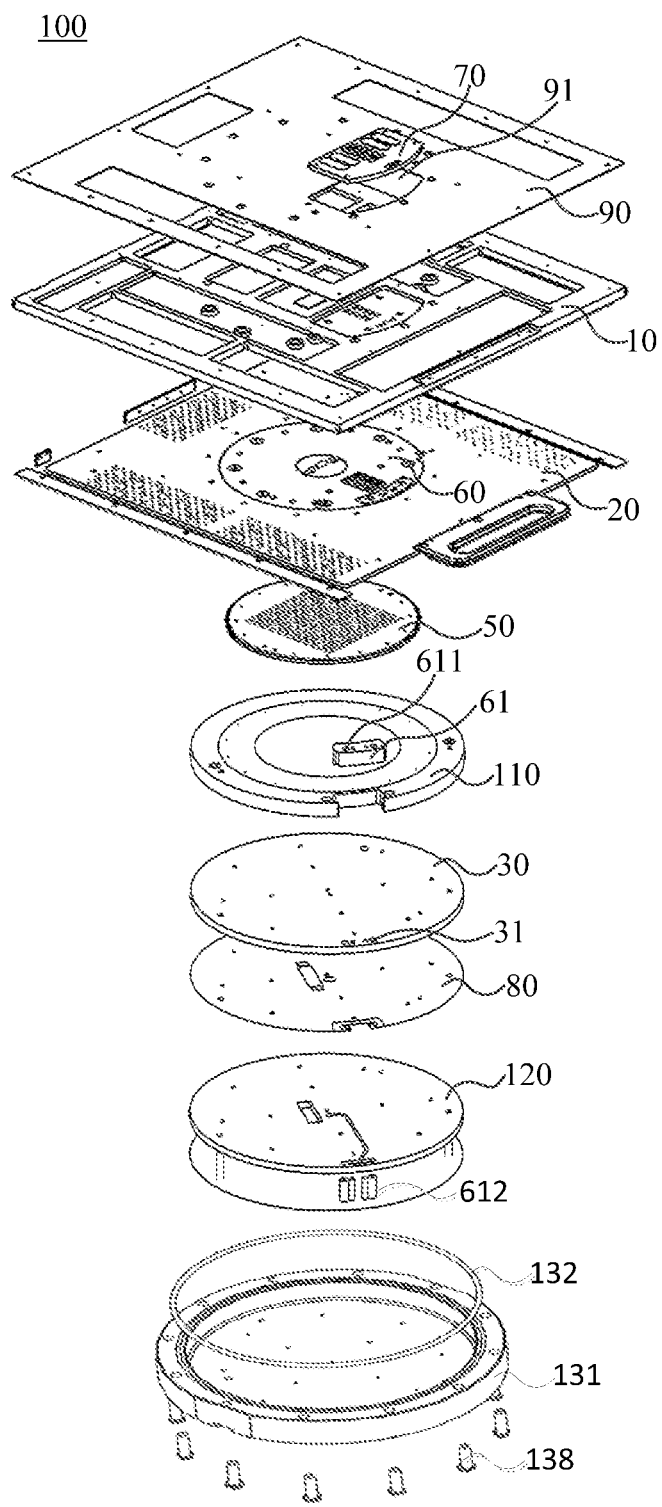
FIG. 2 illustrates an exploded view of an exemplary wafer-level semiconductor high-voltage reliability test fixture according to various disclosed embodiments of the present disclosure.

The present disclosure provides a wafer-level semiconductor high-voltage reliability test fixture 100. The wafer-level semiconductor high-voltage reliability test fixture 100 may be used to perform reliability test on the gate bias (GB) and reverse bias (RB) of wafer-level semiconductors, especially high-voltage MOSFETs. The reverse bias test may need to be tested under high voltage. As shown in FIG. 1 and FIG. 2, the semiconductor high-voltage reliability test fixture 100 may include a first insulation plate 10, a first circuit board 20, and a second insulation plate 30 arranged in sequence. A target object 40 may be provided between the first circuit board 20 and the second insulation plate 30. A probe holder 50 may be also provided on a side of the first circuit board 20 facing the target object 40, and probes may be installed on the probe holder 50. The first circuit board 20 may be connected to the target object 40 through the probes such that the high-voltage electrical signals may be transmitted to the target object 40 through the probes for high-voltage performance testing when applying the high-voltage electrical signals to the first circuit board 20. Further, the high-voltage electrical signals may be isolated from the outside world through the first insulation plate 10 and the second insulation plate 30. The probes may be also configured to transmit test electrical signals to the target object 40 and transmit feedback signals to the first circuit board 20 when the test electrical signals are applied at the first circuit board 20.

In the present disclosure, the probe holder 50 may be provided between the target object 40 and the first circuit board 20. The probe holder 50 may be provided with probes to transmit the high-voltage electrical signals at the first circuit board 20 to the target object 40 to perform high-voltage test on the target object 40. The first insulation plate 10 and the second insulation plate 30 may be provided on two sides of the target object 40 and the first circuit board 20. The first insulation plate 10 and the second insulation plate 30 may prevent the target object 40 from high-voltage spark during high-voltage testing, ensuring the safety of the test when performing the high-voltage test on the target object 40.

In some embodiments, the target object 40 may be a wafer-level semiconductor piece. For example, in one embodiment, the target object 40 may be a SiC wafer, and the size of the SiC wafer may be 4 inches or 6 inches. In some embodiments, the high voltage may range from tens of volts to 3,000 volts to ensure high-voltage reliability testing of wafers.

In some embodiments, both the first insulation plate 10 and the second insulation plate 30 may be made of one of plastic plates or ceramic plates. As an insulating material with good performance, ceramics may be able to effectively prevent high-voltage spark. Although plastic plates are also insulating materials, when the plastic plates are relatively thin and the voltage is high, the plastic plates may be easily broken down by high voltage and cause spark. Therefore, in one embodiment, to ensure that spark is still prevented when the voltage is 3000 volts, the thickness of the plastic plates may need to be 10-20 mm. For example, the thickness may be 10 mm, 15 mm, or 20 mm, and the minimum limit cannot be less than 10 mm.

When the first insulation plate 10 and the second insulation plate 30 may be made of one of plastic plates or ceramic plates, high-voltage spark may be prevented when the high voltage is applied in the test fixture provided by the present disclosure.

In some embodiments, the semiconductor high-voltage reliability test fixture 100 may further include a first heating sheet 60, a second circuit board 70, and an insulation block 61 disposed at the position of the target object 40. The first heating sheet 60 may be disposed on a side of the second insulation plate 30 away from the target object 40. The second circuit board 70 may be used to transmit heating electrical signals to the first heating sheet 60. The second circuit board 70 may be disposed on a side of the first insulation plate 10 away from the first circuit board 20. The insulation block 61 may be disposed at the position of the target object 40. The insulation block 61 may be provided with a plurality of first through holes 611. Conductive posts 612 may be provided in the plurality of first through holes 611. The second insulation plate 30 may be provided with second through holes 31 for the conductive posts 612 to pass through. Therefore, one end of one conductive post 612 is connected to one corresponding probe and another end of the conductive post 612 passes through one corresponding first through hole 611 and one corresponding second through hole 31 to be connected to the first heating sheet 60. The heating electrical signals may pass through the first insulation plate 10 and the first circuit board 20 and then may be transmitted to the first heating sheet 60 through the probes and the conductive posts 612.

In the present disclosure, the heating electrical signals may be transmitted to the first heating sheet 60 through the second circuit board 70 to heat the target object 40, such that the target object 40 may be heated when performing high-voltage performance testing. In one embodiment, while the target object 40 is undergoing high-voltage testing, the target object 40 may also be heated to about 175 degrees, such that the performance of the target object 40 may be tested within the temperature range of this temperature and below.

In some embodiments, the semiconductor high-voltage reliability test fixture 100 may further include a second heating sheet 80. The second heating sheet 80 may be disposed on one side of the first circuit board 20 opposite to the probe holder 50 and may have a shape similar to the shape of the probe holder 50. The second heating sheet 80 may be electrically connected to the second circuit board 70 such that the heating electrical signals of the second circuit board 70 may be transmitted to the first heating sheet 60 and simultaneously to the second heating sheet 80, therefore causing the second heating sheet 80 and the first heating sheet 60 are heated simultaneously.

In the present disclosure, the second heating sheet 80 and the first heating sheet 60 may be respectively disposed on two sides of the probe holder 50 and the target object 40. While the first heating sheet 60 heats the target object 40, the second heating sheet 60 may also heat up. Therefore, scratches on the target object 40 caused by the different heating speeds on two sides of the probes may be prevented.

In one embodiment, as shown in FIG. 3 to FIG. 9, the semiconductor high-voltage reliability test fixture 100 may further include a metal decorative plate 90. The metal decorative plate 90 may be disposed on the side of the first insulation plate 10 away from the first circuit board 20. The metal decorative plate 90 may be provided with a third through hole 91, and the second circuit board 70 may be disposed at the position of the third through hole 91.

Figure 6:
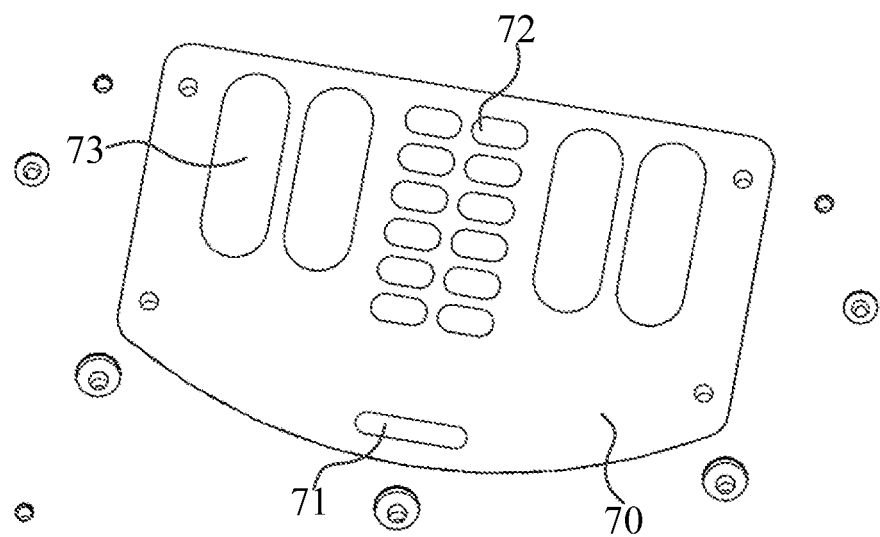
FIG. 6 illustrates an exemplary second circuit board according to various disclosed embodiments of the present disclosure.

As shown in FIG. 6, in one embodiment, the second circuit board 70 may be provided with solder joints of the plurality of probes. The solder joints may include first solder joints 71 for high-voltage power supply, second solder joints 72 for detecting temperature. and third soldering joints 73 for the heating electrical signals.

In one embodiment, the first insulation plate 10 may be disposed between the second circuit board 70 and the first circuit board 20, and the first insulation plate 10 may be provided with probe mounting holes corresponding to the solder joints on the second circuit board 70. The probe mounting holes may be used to mount the probes, and the probes may be used to connect electrical signals between the second circuit board 70 and the first circuit board 20.

In one embodiment, the first circuit board 20 may include solder joints corresponding to the solder joints on the second circuit board 70 to guide the electrical signals at the second circuit board 70 to the target object 40 and the first heating sheet 60 below. The first circuit board 20 may be also provided with solder joints for detecting various properties of the target object 40 through which small currents flow, and solder joints for obtaining electrical signals fed back the target object 40, the first heating sheet 60, and the second heating sheet 80. Therefore, in this embodiment, after the high-voltage electrical signals, the heating electrical signals, and the test electrical signals are input through the first circuit board 20 and the second circuit board 70, the corresponding feedback signals may be detected through external detection devices from the positions of the solder joints, therefore obtaining each electrical signal of the target object 40.

In one embodiment, the metal decorative plate 90, the first insulation plate 10 and the first circuit board 20 may form a three-layer square plate structure. The second heating sheet 80 may be fixed on the first circuit board 20 and located between the first insulation plate 10 and the second circuit board 20. The probe holder 50 may be also fixed on the first circuit board 20 and located on the side of the first circuit board 20 away from the first heating sheet 60.

Figure 3:
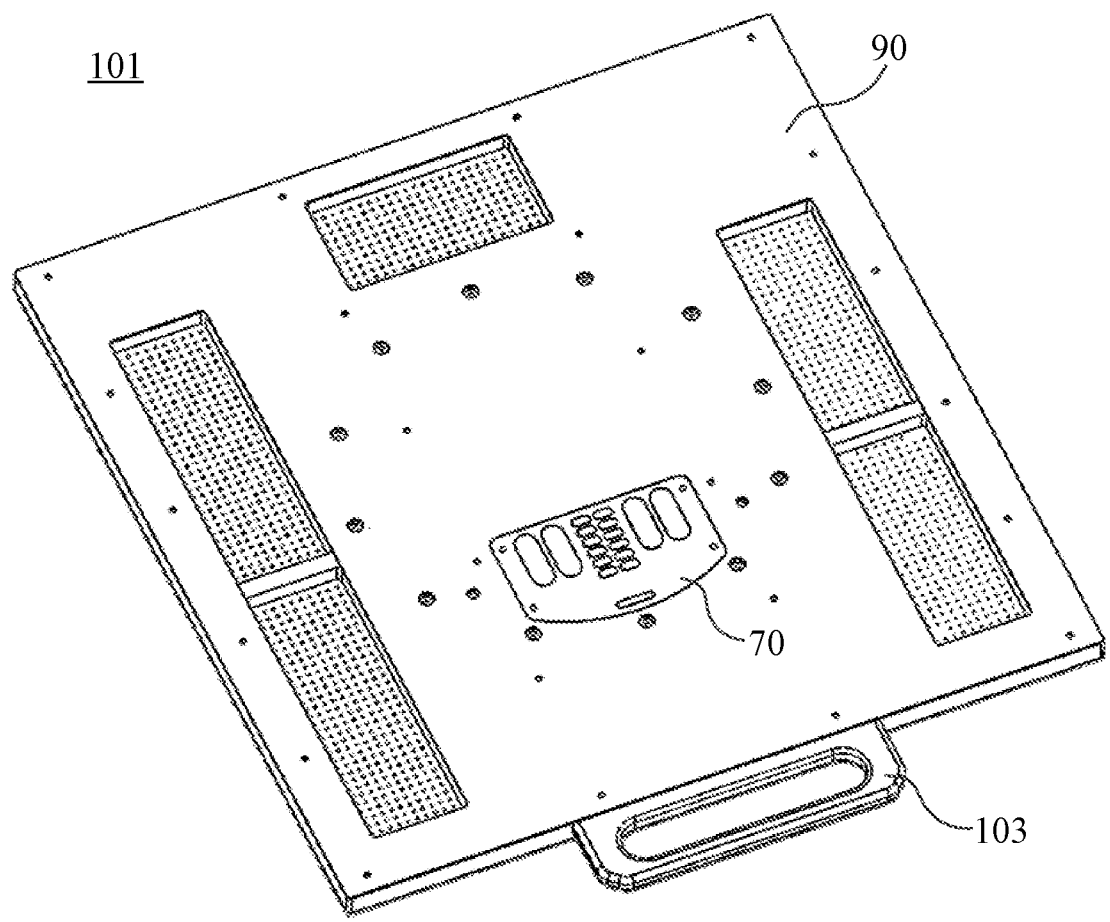
FIG. 3 illustrates an exemplary cover plate according to various disclosed embodiments of the present disclosure.
Figure 4:
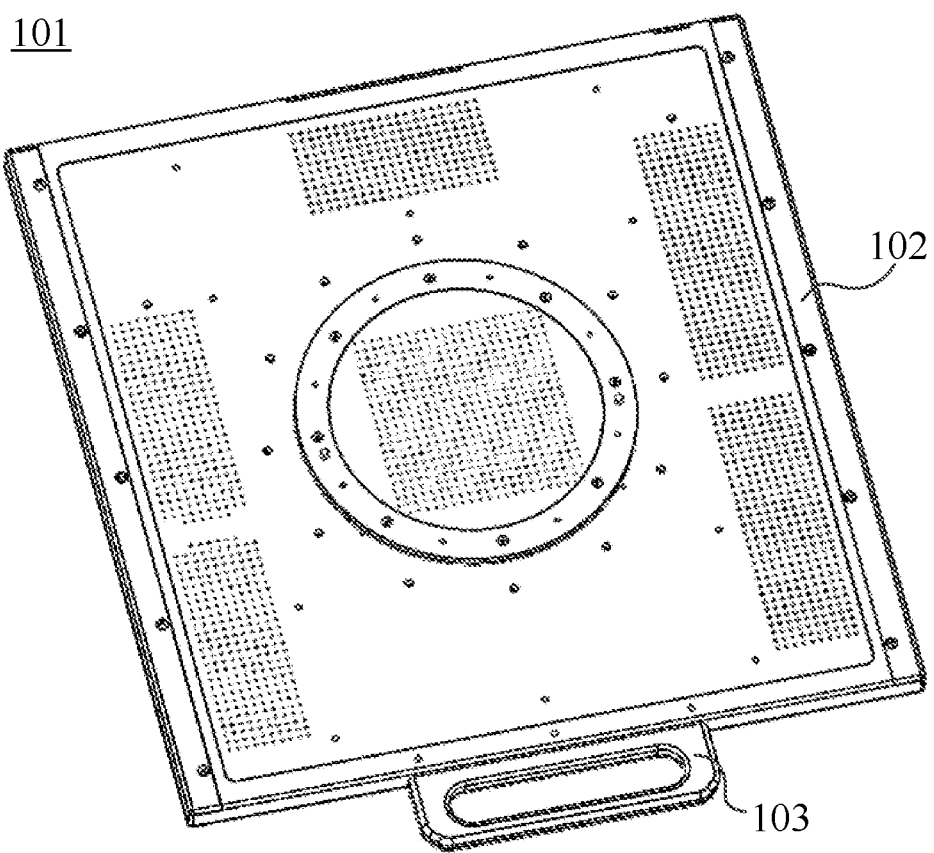
FIG. 4 illustrates a back of an exemplary cover plate according to various disclosed embodiments of the present disclosure.
Figure 5:
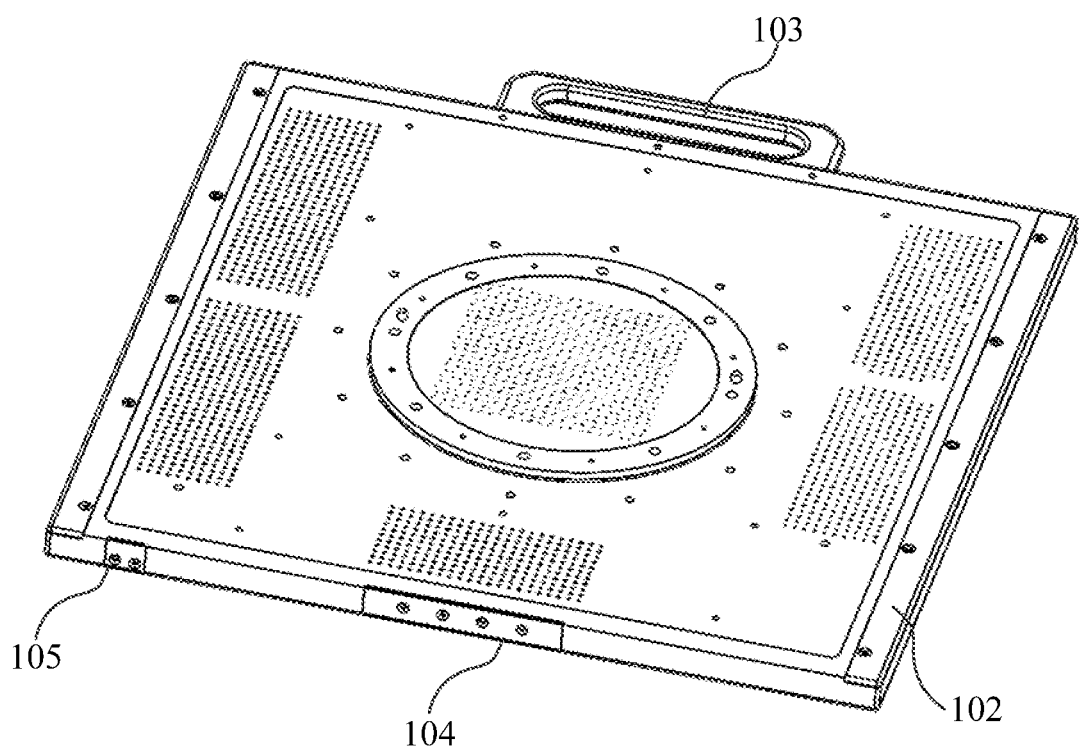
FIG. 5 illustrates a view of a back of an exemplary cover plate from another angle according to various disclosed embodiments of the present disclosure.

In one embodiment shown in FIG. 3 to FIG. 5, the first circuit board 20, the first insulation plate 10 and the metal decorative plate 90 may be fastened to each other to form a cover plate 101, and two metal stripes 102 may be disposed on two opposite sides of the cover plate 101. The metal strips 102 may be used to resist wear when inserted into the drawer. A handle 103 may be provided on another side of the cover plate 101 for easy handling. A magnetic metal piece 104 may be provided on a side of the cover plate 101 opposite to the handle 103. The magnetic metal piece 104 may be used to attract a magnet in the drawer after the fixture is inserted into the drawer. A metal piece 105 may be also provided on the same side of the cover plate 101 as the magnetic metal piece 104. The metal piece 105 may be used for switch detection when a metal sensing device in the drawer approaches, thereby determining whether the fixture has been mounted in place.

Figure 7:
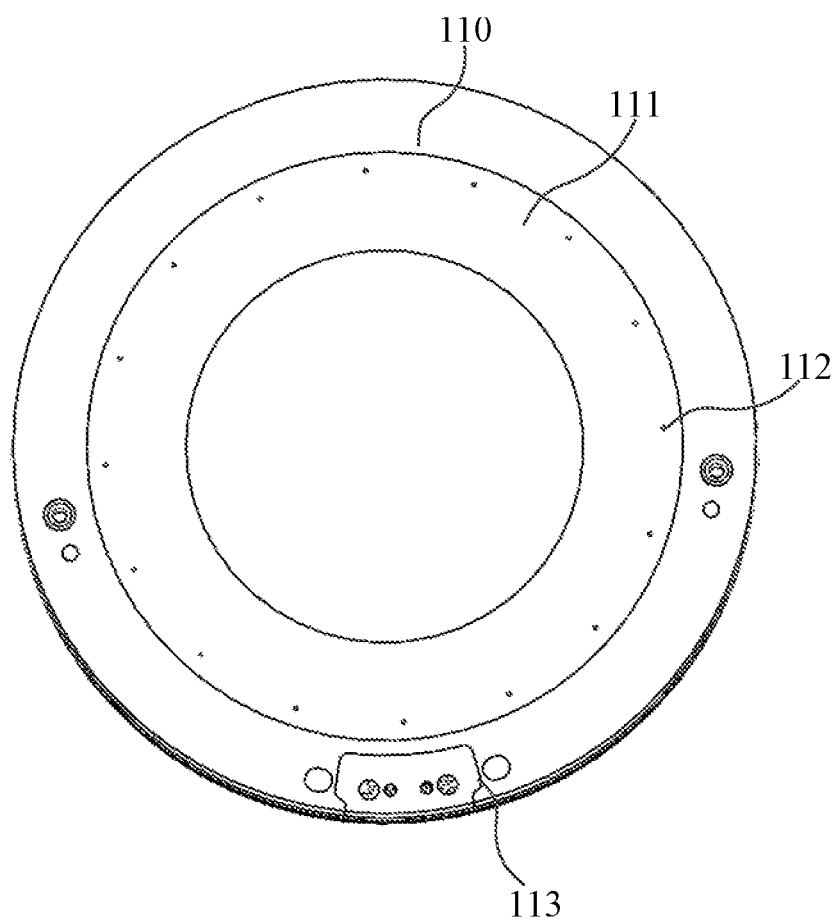
FIG. 7 illustrates an exemplary heat sink according to various disclosed embodiments of the present disclosure.

In one embodiment as shown in FIG. 7, the wafer-level semiconductor high-voltage reliability test fixture 100 may also include a heat sink 110. The target object 40 may be disposed on the heat sink 110, and the heat sink 110 may be disposed between the target object 40 and the first heating sheet 60. The probes may be also connected to the heat sink 110 to transmit high-voltage electrical signals to the heat sink 110. At the same time, the heat at the first heating sheet 60 may be transferred to the target object 40 through the heat sink 110.

In the present embodiment, the target object 40 may be placed on the heat sink 110. When the first heating sheet 60 is heating, the heat may first reach the heat sink 110, and then may be transferred to the target object 40 from the heat sink 110, such that the target object 40 may be heating more evenly.

In one embodiment, the heat sink 110 may have an annular structure, and a step 111 may be formed in the middle of the heat sink 110 for placing the target object 40. The heat sink 110 may be made of a material including copper, or gold-plated copper.

In one embodiment, the wafer-level semiconductor high-voltage reliability test fixture 100 may further include a thermal insulation plate 120 disposed at a side of the first heating sheet 60 away from the second insulation plate 30.

The target object 40, the heat sink 110, the second insulation plate 30, the first heating sheet 60 and the thermal insulation plate 120 may be arranged in sequence below the cover plate 101. The heat sink 110, the second insulation plate 30, the first heating sheet 60 and the thermal insulation plate 120 may have substantially same dimensions and all of them may be circular. The thermal insulation plate 120 may be made of a material including silica gel.

In one embodiment, the heat sink 110 may include at least one vacuum hole 112 and a groove 113. The at least one vacuum hole 112 may be provided on a side surface of the heat sink 110 close to the target object 40, and may be used to tightly attach the target object 40 to the heat sink 110. An external vacuum device may be used to evacuate through the at least one vacuum hole such that the target object 40 is tightly attached to the heat sink 110. The opening of the groove 113 may be provided at the periphery of the heat sink 110 for accommodating the insulation block 61.

Figure 8:
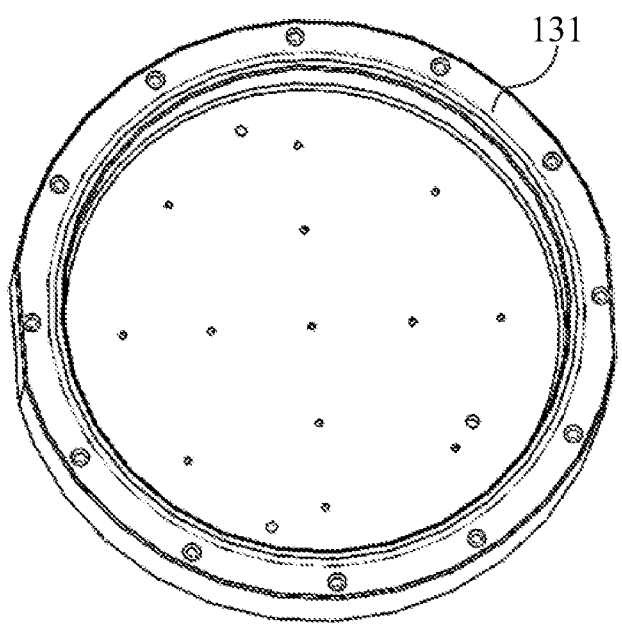
FIG. 8 illustrates an exemplary sealing assembly according to various disclosed embodiments of the present disclosure.
Figure 9:
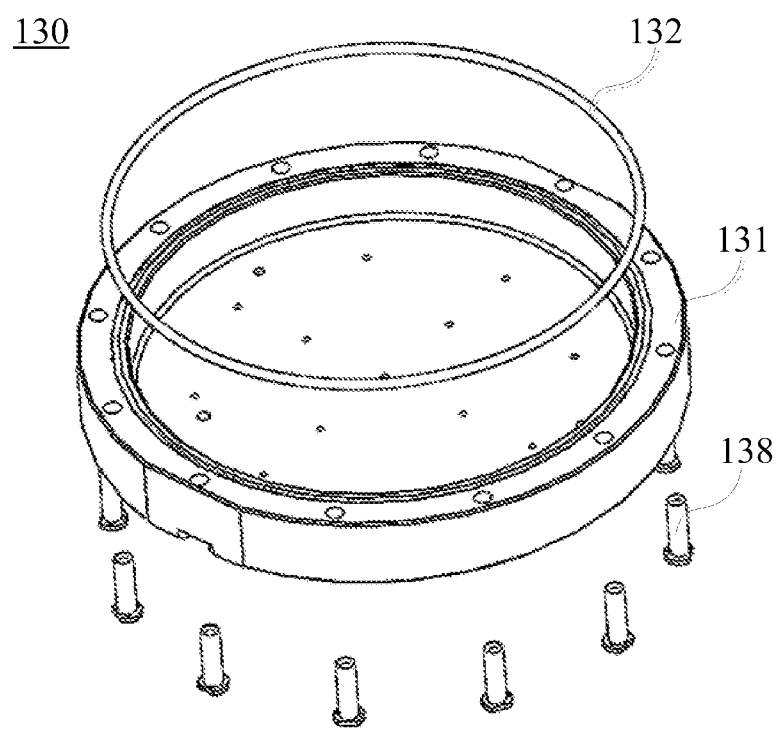
FIG. 9 illustrates an exploded view of an exemplary sealing assembly according to various disclosed embodiments of the present disclosure.
Figure 10:
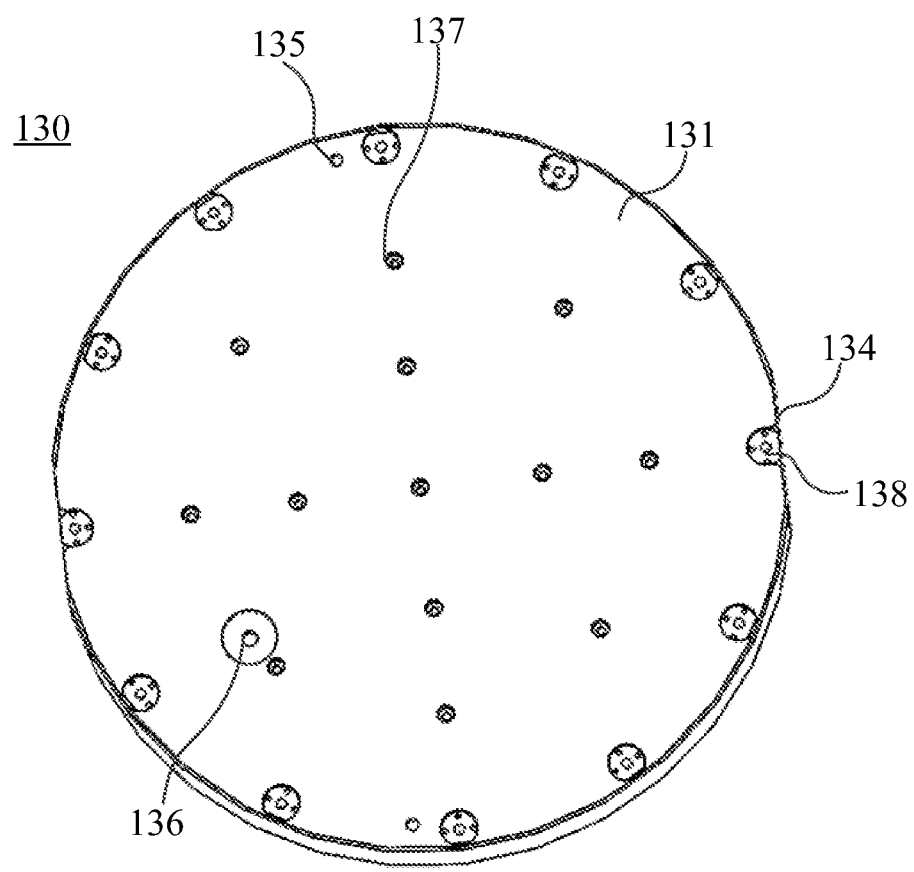
FIG. 10 illustrates a view of an exemplary sealing assembly from another angle according to various disclosed embodiments of the present disclosure.

In one embodiment shown in FIG. 8 to FIG. 10, the wafer-level semiconductor high-voltage reliability test fixture 100 may also include a sealing assembly 130, and the sealing assembly 130 may include a sealing frame 131 and a sealing ring 132. The sealing frame 131 may have a frame structure with an opening, and the opening may be connected to the side of the first circuit board 20 on which the probe holder 50 is arranged to form a sealed cavity. The sealed cavity may be used to accommodate the probe holder 50, the target object 40, the heat sink. 110, the first heating sheet 60, the second insulation plate 30, and the thermal insulation plate 120. The sealing ring 132 may be disposed at the opening of the sealing frame 131 to seal the connection when the sealing frame 131 is connected to the first circuit board 20.

Figure 11:
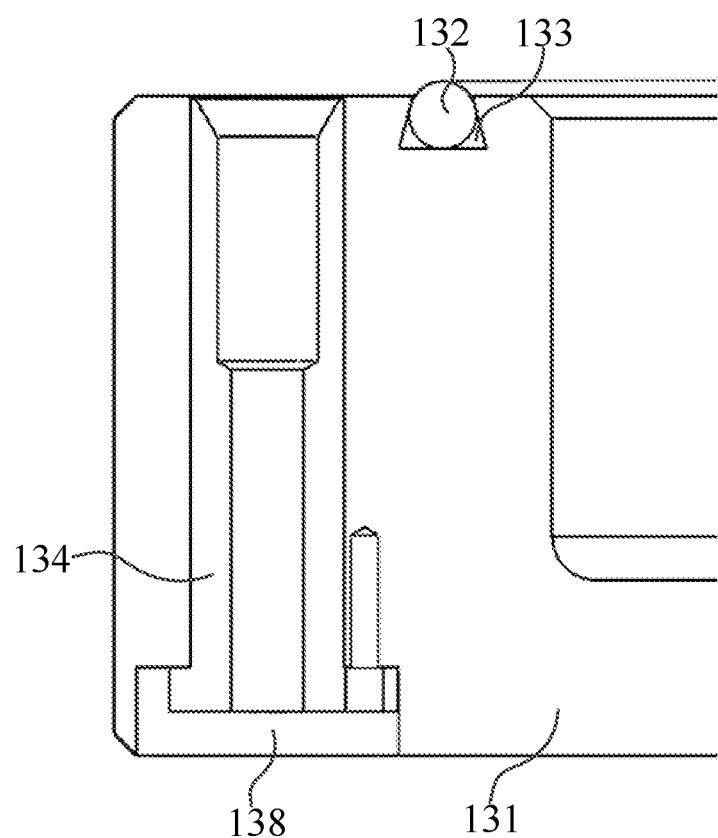
FIG. 11 illustrates a locally enlarged view of a cross section of an exemplary sealing assembly according to various disclosed embodiments of the present disclosure.

As shown in FIG. 11, a sealing ring groove 133 may be provided at the opening of the sealing frame 131. The sealing ring groove 133 may have a dovetail shape. The sealing ring 132 may be inserted into the sealing ring groove 133 and then connected to the sealing frame 131. After the sealing ring 132 is installed in the groove, there may be no need to apply glue or fix it in other ways. The sealing ring 132 may not come out because of clamping of the structure. The depth of the sealing ring groove 133 may be smaller than the diameter of the sealing ring 132. Therefore, when the sealing ring 132 is disposed at the sealing ring groove 133, the sealing ring 132 may be partially exposed, such that the sealing ring 132 is used for contact sealing when the sealing frame 131 is connected to the cover plate 101.

The bottom of the sealing frame 131 may be provided with threaded seat mounting holes 134, positioning holes 135, vacuum suction holes 136 and screw holes 137. The threaded seat mounting holes 134 may be used to install a threaded seat 138. Each threaded seat 138 may include three of the screw holes. The threaded seat mounting hole 134 may not be fully threaded, and may have a section of flushed hole larger than the threaded section for guiding the threaded seat 138. The positioning holes 135 may be used for positioning the sealing frame 131, and the vacuum suction holes 136 may be used for sucking and positioning the wafer (the target object 40). The screw holes 137 may be used to install the heat sink 110.

In the present disclosure, a sealed space may be formed between the sealing assembly 130 and the cover plate 101 as a whole, such that the target object 40 may be prevented from contacting the outside air and oxidation when being heated. And high-voltage isolation may be achieved. Further, the settings of the sealing assembly 130 may also ensure that the pressure in the sealing cavity is able to reach 0.6 mPa. Therefore, the sealing cavity may be filled with high-voltage arc-extinguishing gas to further prevent high-voltage spark.

In the present disclosure, the probe holder may be provided between the target object and the first circuit board. The probe holder may be provided with probes to transmit the high-voltage electrical signals at the first circuit board to the target object to perform high-voltage test on the target object. The first insulation plate and the second insulation plate may be provided on two sides of the target object and the first circuit board. The first insulation plate and the second insulation plate may prevent the target object from high-voltage spark during high-voltage testing, ensuring the safety of the test when performing the high-voltage test on the target object.

Further, the second heating sheet and the first heating sheet may be respectively disposed on two sides of the probe holder and the target object. While the first heating sheet heats the target object, the second heating sheet may also heat up. Therefore, scratches on the target object caused by the different heating speeds on two sides of the probes may be prevented.

Further, a sealed space may be formed between the sealing assembly and the cover plate as a whole, such that the target object may be prevented from contacting the outside air and oxidation when being heated. And high-voltage isolation may be achieved. Further, the setting of the sealing assembly may also ensure that the pressure in the sealing cavity is able to reach 0.6 mPa. Therefore, the sealing cavity may be filled with high-voltage arc-extinguishing gas to further prevent high-voltage spark.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A wafer-level semiconductor high-voltage reliability test fixture, comprising:
   a first insulation plate, a first circuit board, and a second insulation plate arranged in sequence;
   a first heating sheet, disposed on a side of the second insulation plate away from the target object;
   a second circuit board, configured to transmit heating electrical signals to the first heating sheet and disposed on a side of the first insulation plate away from the first circuit board; and
   an insulation block, disposed at the position of the target object,
   wherein:
   a target object is disposed between the first circuit board and the second insulation plate;
   a side of the first circuit board facing the target object is provided with a probe holder, and probes are provided on the probe holder;
   the first circuit board is connected to the target object through the probes such that a high-voltage electrical signal is transmitted to the target object through the probes for high-voltage performance testing when the high-voltage electrical signal is applied to the first circuit board;
   the first insulation plate and the second insulation plate isolate the high-voltage electrical signal from the outside world;
   the probes are also configured to transmit a test electrical signal to the target object and transmit a feedback signal to the first circuit board when the test electrical signal is applied to the first circuit board;
   the insulation block is provided with a plurality of first through holes and conductive posts are provided in the plurality of first through holes;
   the second insulation plate is provided with second through holes for the conductive posts to pass through, such that one end of one conductive post is connected to one corresponding probe and another end of the conductive post is connected to the first heating sheet after passing through one corresponding first through hole and one corresponding second through hole; and
   the heating electrical signals pass through the first insulation plate and the first circuit board, and are transmitted to the first heating sheet through the probes and the conductive posts.

2. The test fixture according to claim 1, wherein:
   the first insulation plate and the second insulation plate are each made of a plastic plate or a ceramic plate.

3. The test fixture according to claim 2, wherein:
   the dimension of the plastic plate is about 10 mm to about 20 mm.

4. The test fixture according to claim 1, further including a second heating sheet, wherein:
   the second heating sheet is disposed on a side of the first circuit board opposite to the probe holder, and has a shape matching the probe holder; and
   the second heating sheet is electrically connected to the second circuit board such that the heating electrical signals of the second circuit board are transmitted to the first heating sheet and the second heating sheet simultaneously, therefore causing the second heating sheet and the first heating sheet to heat simultaneously.

5. The test fixture according to claim 1, further including a heat sink, wherein:
   the target object is disposed on the heat sink and the heat sink is disposed between the target object and the first heating sheet; and
   the probes are also connected to the heat sink to transmit the high-voltage electrical signal to the heat sink and then to the target object; and heat at the first heating sheet is transferred to the target object through the heat sink at the same time.

6. The test fixture according to claim 5, wherein:
   the heat sink includes:
   at least one vacuum hole disposed at a side surface of the heat sink close to the target object, wherein the at least one vacuum hole is configured to tightly attach the target object to the heat sink; and
   a groove, wherein an opening of the groove is provided on a periphery of the heat sink for accommodating the insulation block.

7. The test fixture according to claim 5, further including:
   a thermal insulation plate disposed on a side of the first heating sheet away from the second insulation plate.

8. The test fixture according to claim 7, further including:
   a sealing assembly including a sealing frame and a sealing ring, wherein:
   the sealing frame forms a frame structure with an opening;
   the opening is connected to a side of the first circuit board on which the probe holder is provided, to form a sealing cavity;
   the sealing cavity is configured to accommodate the probe holder, the target object, the heat sink, the first heating sheet, the second insulation plate, and the thermal insulation plate; and
   the sealing ring is disposed at the position of the opening of the sealing frame for sealing when the sealing frame is connected to the first circuit board.

9. The test fixture according to claim 4, further including a metal decorative plate, wherein:
   the metal decorative plate is provided on the side of the first insulating plate away from the first circuit board; and
   third through holes are provided on the metal decorative plate and the second circuit board is provided on the positions of the third through holes.

* * * * *